(12) United States Patent
Kanda

(10) Patent No.: US 10,361,189 B2
(45) Date of Patent: Jul. 23, 2019

(54) SEMICONDUCTOR DEVICE AND MANUFACTURING METHOD THEREOF

(71) Applicant: Renesas Electronics Corporation, Tokyo (JP)

(72) Inventor: Ryo Kanda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/955,819

(22) Filed: Apr. 18, 2018

(65) Prior Publication Data

US 2018/0358438 A1 Dec. 13, 2018

(30) Foreign Application Priority Data

Jun. 9, 2017 (JP) .................................. 2017-114048

(51) Int. Cl.
*H01L 27/06* (2006.01)
*H01L 29/08* (2006.01)
(Continued)

(52) U.S. Cl.
CPC .... *H01L 27/0623* (2013.01); *H01L 21/02164* (2013.01); *H01L 29/0804* (2013.01);
(Continued)

(58) Field of Classification Search
CPC ............. H01L 29/0804; H01L 29/0817; H01L 29/4232; H01L 29/7393;
(Continued)

(56) References Cited

U.S. PATENT DOCUMENTS 5,329,142 A   7/1994 Kitagawa et al.
5,341,021 A * 8/1994 Maeda ................ H01L 27/0623
                                                        257/557

(Continued)

FOREIGN PATENT DOCUMENTS

JP    3367747 B2    1/2003

OTHER PUBLICATIONS

Masakiyo Sumitomo, et al., Injection Control Technique for High Speed Switching with a double gate PNM-IGBT, Proceedings of the 25th International Symposium on Power Semiconductor Devices & ICs, Kanazawa, 2009, p. 33-36.

*Primary Examiner* — Scott B Geyer
(74) *Attorney, Agent, or Firm* — Mattingly & Malur, PC

(57) ABSTRACT

According to one embodiment, a semiconductor device includes a semiconductor substrate, a trench electrode provided in a trench, a trench insulating film provided between the trench electrode and the semiconductor substrate, a MOS electrode provided near the trench electrode, and a MOS insulating film provided between the MOS electrode and the semiconductor substrate, in which the semiconductor substrate includes a first semiconductor layer, a second semiconductor layer provided over the first semiconductor layer, a third semiconductor layer provided over the second semiconductor layer, a fourth semiconductor layer provided below the MOS electrode, and one and the other of fifth semiconductor layers provided on both sides of the fourth semiconductor layer, and in which the semiconductor device further includes a wiring layer that couples the one of the fifth semiconductor layers and the second semiconductor layer together.

11 Claims, 8 Drawing Sheets

(51) Int. Cl.
*H01L 21/02* (2006.01)
*H01L 29/43* (2006.01)
*H01L 29/739* (2006.01)
*H01L 29/66* (2006.01)
*H01L 29/423* (2006.01)

(52) U.S. Cl.
CPC ...... *H01L 29/42304* (2013.01); *H01L 29/435* (2013.01); *H01L 29/66325* (2013.01); *H01L 29/7397* (2013.01); *H01L 29/4232* (2013.01); *H01L 29/7393* (2013.01); *H01L 2924/13055* (2013.01)

(58) Field of Classification Search
CPC . H01L 29/7395–7397; H01L 29/41708; H01L 2924/13055; H01L 29/66325; H01L 27/0623; H01L 27/0716; H01L 29/7835; H01L 29/42304; H01L 29/1004–1008; H01L 29/0852–0886; H01L 29/0847; H01L 29/7801
See application file for complete search history.

(56) References Cited

U.S. PATENT DOCUMENTS

| | | | | |
|---|---|---|---|---|
| 5,525,826 | A * | 6/1996 | Palara | H01L 27/0716 257/378 |
| 6,580,108 | B1 * | 6/2003 | Utsumi | H01L 29/42312 257/288 |
| 2003/0047778 | A1 * | 3/2003 | Nakamura | H01L 29/0696 257/330 |
| 2006/0006386 | A1 * | 1/2006 | Hirler | H01L 29/404 257/60 |
| 2009/0294870 | A1 * | 12/2009 | Arai | H01L 21/823437 257/378 |
| 2011/0127615 | A1 * | 6/2011 | Tanaka | H01L 21/8249 257/378 |
| 2013/0037880 | A1 * | 2/2013 | Liu | H01L 29/6634 257/330 |
| 2015/0060937 | A1 * | 3/2015 | Hikasa | H01L 29/7397 257/139 |
| 2015/0287650 | A1 * | 10/2015 | Chang | H01L 21/225 438/236 |
| 2016/0133620 | A1 * | 5/2016 | Pedone | H01L 27/0259 257/140 |

* cited by examiner

SEMICONDUCTOR DEVICE AND MANUFACTURING METHOD THEREOF

CROSS-REFERENCE TO RELATED APPLICATIONS

The disclosure of Japanese Patent Application No. 2017-114048 filed on Jun. 9, 2017 including the specification, drawings and abstract is incorporated herein by reference in its entirety.

BACKGROUND

The present invention relates to a semiconductor device and a manufacturing method thereof, and, for example, to a semiconductor device including an IGBT having a trench gate structure and a manufacturing method thereof.

In an IGBT (Insulated Gate Bipolar Transistor), a turn-off loss Eoff at switching and a saturation voltage Vce (sat) related to conduction loss are characteristics to be taken into consideration in design. However, there is a trade-off relationship between them. That is, when the turn-off loss Eoff is reduced, the saturation voltage Vce (sat) is deteriorated, and when the saturation voltage Vce (sat) is reduced, the turn-off loss Eoff is deteriorated.

RELATED ART DOCUMENT

Patent Document

[Patent Document 1] Japanese Patent Publication No. 3367747

Non-Patent Document

[Non-Patent Document 1] Masakiyo Sumitomo, Hiroki Sakane, Kazuki Arakawa, Yasushi Higuchi and Masaki Matsui, "Injection Control Technique for High Speed Switching with a double gate PNM-IGBT", Proceedings of The 25th International Symposium on Power Semiconductor Devices & ICs, Kanazawa, p. 33-36, 2009.

SUMMARY

In an IGBT, there is a trade-off relationship between the turn-off loss Eoff and the saturation voltage Vce (sat) related to conduction loss, as illustrated in FIG. 14. In an IGBT, such a trade-off between them is related to a carrier concentration in a conductive state. When the carrier concentration is high, an on-voltage and the saturation voltage Vce (sat) decrease. In that case, however, it takes time to discharge carriers at turning-off, and the turn-off loss Eoff increases.

In particular, an IGBT for inverter may have a p-type floating layer, as illustrated in FIG. 15. The IGBT can accumulate carriers by having such a structure. Therefore, the saturation voltage Vce (sat) related to conduction loss can be reduced. However, in a structure in which carries are accumulated in such a p-type floating layer, it is difficult to reduce the turn-off loss Eoff induced by carrier discharge.

Other problems and new characteristics will become clear from the description and accompanying drawings of the present specification.

According to one embodiment, a semiconductor device includes a semiconductor substrate having an upper surface, a trench electrode provided in a trench formed in the upper surface, a trench insulating film provided between the trench electrode and the semiconductor substrate, a MOS electrode provided over the semiconductor substrate near the trench electrode, and a MOS insulating film provided between the MOS electrode and the semiconductor substrate, in which the semiconductor substrate includes a first semiconductor layer of a first conductivity type that the lower end of the trench electrode has reached, a second semiconductor layer of a second conductivity type that is provided over the first semiconductor layer and is in contact with the trench insulating film, a third semiconductor layer of a first conductivity type provided over the second semiconductor layer, a fourth semiconductor layer provided below the MOS electrode, a MOS insulating film provided between the MOS electrode and the fourth semiconductor layer, and one and the other of fifth semiconductor layers provided on both sides of the fourth semiconductor layer so as to sandwich the fourth semiconductor layer, and in which the semiconductor device further includes a wiring layer coupling the one of the fifth semiconductor layers and the second semiconductor layer together.

According to the one embodiment, a semiconductor device, in which the trade-off between the turn-off loss Eoff and the saturation voltage Vce (sat) related to conduction loss can be improved, and a manufacturing method of the semiconductor device can be provided.

DETAILED DESCRIPTION

Figure 1:
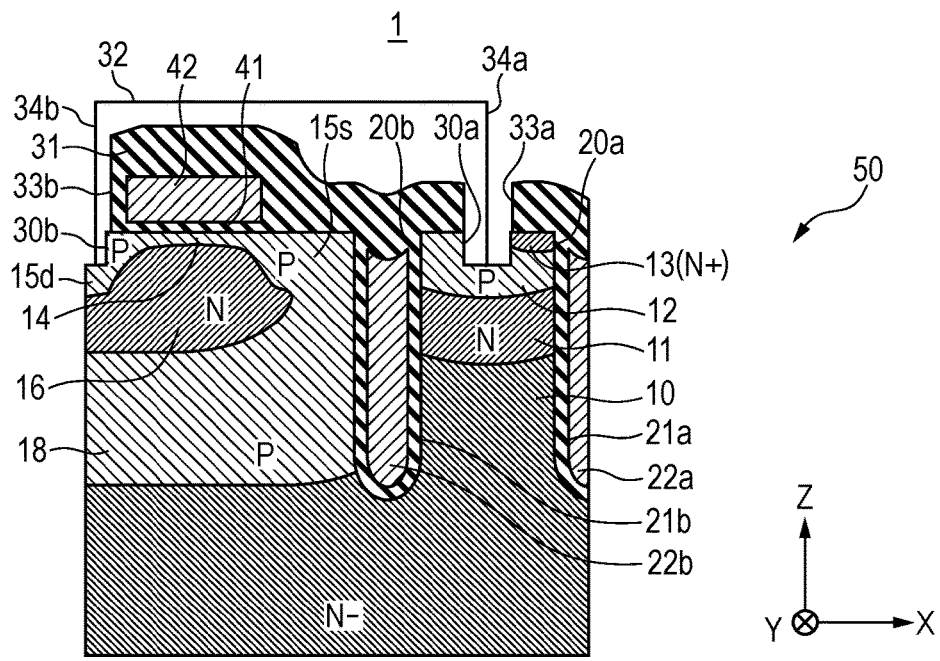
FIG. 1 is a sectional view illustrating a semiconductor device according to First Embodiment.

For clarity of description, abbreviation and simplification are appropriately made in the following description and drawings. Also, in each drawing, the same reference numerals are assigned to the same elements, and duplicative description is omitted as necessary.

First Embodiment: Configuration

A semiconductor device according to First Embodiment and a manufacturing method thereof will be described. First, the configuration of a semiconductor device according to First Embodiment will be described. FIG. 1 is a sectional view illustrating a semiconductor device according to First Embodiment. In FIG. 1, an emitter wiring layer 32 and contacts 34a and 34b, which are provided in the upper portion of a semiconductor device 1, are schematically illustrated.

The semiconductor device 1 includes a semiconductor substrate 50, as illustrated in FIG. 1. The semiconductor substrate 50 has a drift layer 10, a hole barrier layer 11, a body layer 12, an emitter layer 13, a channel layer 14, a source layer 15s, a drain layer 15d, a well layer 16, and a floating layer 18. The semiconductor substrate 50 is, for example, a silicon substrate containing silicon. However, the semiconductor substrate 50 is not limited to a silicon substrate containing silicon, but may be one containing another semiconductor material. The main surface of the semiconductor substrate 50 is referred to as an upper surface. The semiconductor substrate 50 has an upper surface. The drift layer 10 and the hole barrier layer 11 are also collectively referred to as a first semiconductor layer. The body layer 12 is also referred to as a second semiconductor layer. The emitter layer 13 is also referred to as a third semiconductor layer.

Trenches 20 (20a, 20b) are formed in the upper surface of the semiconductor substrate 50. A plurality of the trenches 20a and 20b are formed in the view, but when it comes to the trench 20, it means a trench collectively referred to, not limiting to the trench 20a or the trench 20b.

The trench 20 extends in one direction in a plane parallel to the upper surface of the semiconductor substrate 50. A plurality of the trenches 20 each extending in the one direction may be provided in the upper surface of the semiconductor substrate 50. The trenches 20 are arranged side by side in another direction perpendicular to the one direction in a plane parallel to the upper surface of the semiconductor substrate 50.

Herein, an XYZ-orthogonal coordinate axis system is introduced to describe the semiconductor device 1. The direction perpendicular to the upper surface of the semiconductor substrate 50 is defined as a Z-axis direction. For convenience, the +Z-axis direction is referred to as an upside, and the −Z-axis direction to as a downside. Each direction of the XYZ-orthogonal coordinate axes and the upside and downside are directions defined for convenience of description of the semiconductor device 1, and hence when the semiconductor device 1 is used, the upper surface of the semiconductor substrate 50 should not be limited to facing the +Z-axis direction, or the upside. The one direction in a plane parallel to the upper surface of the semiconductor substrate 50 is defined as a Y-axis direction. Therefore, the one direction in which the trench 20 extends is the Y-axis direction. The another direction perpendicular to the one direction in a plane parallel to the upper surface of the semiconductor substrate 50 is defined as an X-axis direction. The trenches 20 are formed side by side in the X-axis direction.

Of the trenches 20, one of the adjacent trenches 20 is referred to as the trench 20a, and the other as the trench 20b. For example, the trench 20 on the +X-axis direction side is referred to as the trench 20a, and the trench 20 formed on the −X-axial direction side from the trench 20a is referred to as the trench 20b.

Trench insulating films 21 (21a, 21b) are formed over the inner surface of the trench 20. A plurality of the trench insulating films 21a and 21b are formed in the view, but when it comes to the trench insulating film 21, it means a trench collectively referred to, not limiting to the trench insulating film 21a or the trench insulating film 21b.

The trench insulating film 21 includes, for example, a silicon oxide film as a material. However, the trench insulating film 21 may include an insulating film other than a silicon oxide film. The trench insulating film 21 formed over the inner surface of the trench 20a is referred to as the trench insulating film 21a. The trench insulating film 21 formed over the inner surface of the trench 20b is referred to as the trench insulating film 21b.

Trench electrodes 22 (22a, 22b) are provided in the trenches 20 formed in the upper surface of the semiconductor substrate 50. A plurality of the trench electrodes 22a and 22b are formed in the view, but when it comes to the trench electrode 22, it means a trench electrode collectively referred to, not limiting to the trench electrode 22a or the trench electrode 22b.

The trench electrode 22 is formed in the trench 20 via the trench insulation film 21. Therefore, the trench insulating film 21 is provided between the trench electrode 22 and the semiconductor substrate 50. The trench electrode 22 contains, for example, polysilicon as a conductive material. Therefore, in the trench electrode 22, a conductive material is buried in the trench 20.

Similarly to the trench 20, the trench electrode 22 extends in the one direction, that is, in the Y-axis direction. A plurality of the trench electrodes 22 may be provided by burying a conductive material in the trenches 20. When the trench electrodes 22 are provided, they are arranged side by side in the another direction, that is, in the X-axis direction. The trench electrode 22 formed in the trench 20a is referred to as the trench electrode 22a. The trench electrode 22 formed in the trench 20b is referred to as the trench electrode 22b.

A contact trench 30a is formed in the upper surface of the semiconductor substrate 50. The contact trench 30a is formed to extend, in a plane parallel to the upper surface of the semiconductor substrate 50, in the one direction, that is, in the Y-axis direction. The contact trench 30a is arranged side by side with the trench 20. When the trenches 20 are formed, the contact trench 30a is arranged, for example, between the adjacent trenches 20. For example, the contact trench 30a is provided between the trench 20a and the trench 20b. The length, in the Z-axis direction, of the contact trench 30a is smaller than that of the trench 20. That is, the depth of the contact trench 30a is smaller than that of the trench 20.

A portion of the semiconductor substrate 50, which is in contact with the trench insulating film 21, is referred to as an IGBT region. The IGBT region is provided, for example, between the adjacent trench electrodes 22. The IGBT region is provided, for example, between the adjacent trench electrodes 22a and 22b.

A MOS region is provided near the IGBT region. The MOS region is located, for example, on the side opposite to the IGBT region when viewed from the trench electrode 22b. However, the MOS region may not be located on the side opposite to the IGBT region when viewed from the trench electrode 22b. If the MOS region is provided near the IGBT region, an arbitrary region may be included, for example, between the IGBT region and the MOS region. As described above, the semiconductor device 1 includes the IGBT region and the MOS region. First, the configuration of the IGBT region will be described.

First Embodiment: IGBT Region

In the IGBT region, for example, between the adjacent trench electrodes 22, the drift layer 10, the hole barrier layer 11, the body layer 12, and the emitter layer 13 are laminated in order from below. The emitter layer 13 is laminated over the body layer 12 between the trench 20a and the contact trench 30a adjacent to the trench 20a. The drift layer 10, the hole barrier layer 11, the body layer 12, and the emitter layer 13 are in contact with the trench insulating film 21a in the semiconductor substrate 50 in the IGBT region.

The drift layer 10 is, for example, an n-type semiconductor layer doped with a low concentration of n-type impurities. The drift layer 10 is in contact with the trench insulating film 21. For example, the drift layer 10 is in contact with the trench insulating films 21a and 21b. The lower end of the trench 20 and that of the trench electrode 22 reach the drift layer 10. For example, the lower end of the trench 20a and that of the trench electrode 22a are located in the drift layer 10. Herein, the lower end of the trench 20b and that of the trench electrode 22b may be located in the drift layer 10.

For convenience, an n-type, an n--type, or an n+-type is referred to as a first conductivity type, and a p-type, a p--type, or a p+-type is referred to as second conductivity type. Alternatively, an n-type, an n--type, or an n+-type may be referred to as a second conductivity type, and a p-type, a p--type, or a p+-type may be referred to as a first conductivity type. In addition, the fact that a low concentration of n-type impurities are doped is referred to as an n--type, the fact that a high concentration of n-type impurities are doped is referred to as an n+-type, and the fact that a concentration of n-type impurities, the concentration being higher than the low concentration and lower than the high concentration, are doped is referred to as an n-type. Similarly, the fact that a low concentration of p-type impurities are doped is referred to as an p--type, the fact that a high concentration of p-type impurities are doped is referred to as a p+-type, and the fact that a concentration of p-type impurities, the concentration being higher than the low concentration and lower than the high concentration, are doped is referred to as a p-type.

The drift layer 10 is referred to as the first semiconductor layer. Herein, the hole barrier layer 11 may be provided over the drift layer 10. In that case, the first semiconductor layer includes the drift layer 10 and the hole barrier layer 11. The hole barrier layer 11 is in contact with the trench insulating film 21 provided over the side surface of the trench 20. For example, the hole barrier layer 11 is in contact with the trench insulating films 21a and 21b. Therefore, the first semiconductor layer is in contact with the trench insulating films 21a and 21b. The hole barrier layer 11 is, for example, an n-type semiconductor layer doped with n-type impurities.

The body layer 12 is provided over the first semiconductor layer. The body layer 12 is in contact with the trench insulating film 21 provided over the side surface of the trench 20. For example, the body layer 12 is in contact with the trench insulating films 21a and 21b. The body layer 12 is, for example, a p-type semiconductor layer doped with p-type impurities. The lower end of the contact trench 30a is located in the body layer 12. The lower surface of the body layer 12 is in contact with the first semiconductor layer.

The emitter layer 13 is provided over the body layer 12. The trench insulating film 21 may be provided between the trench electrode 22 and those of the emitter layer 13, the body layer 12, and the first semiconductor layer.

The emitter layer 13 is in contact with the trench insulating film 21 provided over the side surface of the trench 20. For example, the emitter layer 13 is in contact with the trench insulating film 21a provided over the side surface of the trench 20a. The emitter layer 13 is provided to extend between the trench 20 and the contact trench 30a adjacent to the trench 20. For example, the emitter layer 13 is provided between the trench 20a and the contact trench 30a. The emitter layer 13 is, for example, an n+-type semiconductor layer doped with a high concentration of n-type impurities. When the trench electrodes 22 are provided, the second and third semiconductor layers are provided between the adjacent trench electrodes 22. The MOS electrode 42 is provided over the semiconductor substrate 50 other than between the adjacent trench electrodes 22.

First Embodiment: MOS Region

Next, the configuration of the MOS region will be described. The MOS electrode 42 is provided over the semiconductor substrate 50 in the MOS region. Therefore, the MOS electrode 42 is provided over the semiconductor substrate 50 near the trench electrode 22. The MOS electrode 42 contains a conductive material. The MOS electrode 42 extends, for example, in a plane parallel to the upper surface of the semiconductor substrate 50, in the one direction, that is, in the Y-axis direction.

The MOS insulating film 41 is provided between the MOS electrode 42 and the semiconductor substrate 50. The MOS insulating film 41 includes, for example, a silicon oxide film as a material. However, the MOS insulating film 41 may include an insulating film other than a silicon oxide film.

The semiconductor substrate 50 in the MOS region includes the drift layer 10, the channel layer 14, the drain layer 15d, the source layer 15s, the well layer 16, and the floating layer 18. The channel layer 14 is also referred to as the fourth semiconductor layer. The drain layer 15d and the source layer 15s are also referred to as one and the other of the fifth semiconductor layers. The drift layer 10 is provided in the lower portion of the semiconductor substrate 50 so as to extend from the IGBT region to the MOS region.

The channel layer 14 is provided below the MOS electrode 42. The channel layer 14 is in contact with the MOS insulating film 41. Therefore, the MOS insulating layer 41 is provided between the MOS electrode 42 and the channel layer 14. The channel layer 14 is provided over the well layer 16. The channel layer 14 is, for example, a p-type semiconductor layer doped with p-type impurities.

The drain layer 15d and the source layer 15s are provided on both sides of the channel layer 14 so as to sandwich the channel layer 14. Therefore, the drain layer 15d and the source layer 15s are one and the other of the fifth semiconductor layers provided on both sides of the channel layer 14.

Each of the drain layer 15d and the source layer 15s is, for example, a p-type semiconductor layer doped with p-type impurities. The fourth and fifth semiconductor layers may have the same conductivity type. The source layer 15s may be in contact with the trench insulating film 21b.

The well layer 16 is provided below the channel layer 14, the drain layer 15d, and the source layer 15s so as to extend among them. The well layer 16 is, for example, an n-type semiconductor layer doped with n-type impurities.

The floating layer 18 is provided below the well layer 16. The floating layer 18 is provided over the drift layer 10 in the MOS region. The lower end of the trench electrode 22b may be located in the floating layer 18. The floating layer 18 may be in contact with the trench insulating film 21b. The floating layer 18 may be in contact with the source layer 15s. The floating layer 18 is a p-type semiconductor layer doped with p-type impurities. The impurity concentration of each of the drain layer 15d and the source layer 15s may be higher than that of the floating layer 18.

The contact trench 30b is formed in the upper surface of the semiconductor substrate 50. The contact trench 30b is formed to extend, in a plane parallel to the upper surface of the semiconductor substrate 50, in the one direction, that is, in the Y-axis direction. The contact trench 30b is arranged side by side with the trench 20. The contact trench 30b is provided, for example, in the upper surface of the drain layer 15d. The length, in the Z-axis direction, of the contact trench 30b is smaller than that of the trench 20. That is, the depth of the contact trench 30b is smaller than that of the trench 20.

As described above, the semiconductor device 1 includes the trench insulating film 21, the trench electrode 22, the MOS insulating film 41, and the MOS electrode 42 in addition to the semiconductor substrate 50. The semiconductor device 1 may further include an interlayer insulating film 31, the emitter wiring layer 32, a field stop layer, a collector layer, and a collector wiring layer.

The interlayer insulating layer 31 is provided over each of the semiconductor substrate 50, the trench electrode 22, and the MOS electrode 42. The interlayer insulating layer 31 is provided over each of the body layer 12, the emitter layer 13, the drain layer 15d, and the source layer 15s in the semiconductor substrate 50. Through trenches 33a and 33b are provided in the interlayer insulating layer 31. The through trenches 33a and 33b are formed to penetrate the interlayer insulating layer 31. The through trench 33a communicates with the contact trench 30a. The through trench 33b communicates with the contact trench 30b. The interlayer insulating layer 31 includes, for example, a silicon oxide film as an insulating material. However, the interlayer insulating layer 31 may contain an insulating material other than a silicon oxide film.

The emitter wiring layer 32 is provided over the interlayer insulating layer 31. The emitter wiring layer 32 is coupled with the body layer 12 via the contact 34a. The contact 34a is provided in both the through trench 33a penetrating the interlayer insulating layer 31 and the contact trench 30a formed in the body layer 12. Therefore, the lower end of the contact 34a is located below the upper end of the body layer 12.

In addition, the emitter wiring layer 32 is coupled with the drain layer 15d via the contact 34b. The contact 34b is provided in both the through trench 33b penetrating the interlayer insulating layer 31 and the contact trench 30b formed in the drain layer 15d. Therefore, the lower end of the contact 34b is located below the upper end of the drain layer 15d.

As described above, the emitter wiring layer 32 couples the drain layer 15d that is the one of the fifth semiconductor layers and the body layer 12 together.

A contact layer may be provided between the contact 34a and the body layer 12. In addition, a contact layer may be provided between the contact 34b and the drain layer 15d. The contact layer is, for example, a p+-type semiconductor layer doped with a high concentration of p-type impurities.

Each of the emitter wiring layer 32 and the contacts 34a and 34b contains, for example, aluminum (Al) as a conductive material. However, each of the emitter wiring layer 32 and the contacts 34a and 34b may contain a conductive material other than aluminum. In addition, a barrier metal may be provided between those of the emitter wiring layer 32 and the contacts 34a and 34b and those of the interlayer insulating layer 31, the body layer 12, and the drain layer 15d.

An unillustrated field stop layer may be provided below the drift layer 10. The field stop layer is, for example, an n-type semiconductor layer doped with n-type impurities. An unillustrated collector layer may be provided below the field stop layer. The collector layer is, for example, a p-type semiconductor layer doped with p-type impurities. A collector wiring layer may be provided below the collector layer. The collector wiring layer contains, for example, aluminum (Al) as a conductive material. However, the collector wiring layer may contain a conductive material other than aluminum.

First Embodiment: Operation

Next, the operation of the semiconductor device 1 according to the present embodiment will be described. The semiconductor device 1 of the embodiment has a MOS transistor. In the semiconductor device 1, the MOS electrode 42, the MOS insulating film 41, the channel layer 14, the drain layer 15d, and the source layer 15s form a depletion-type MOS transistor. Therefore, when a positive voltage is applied to the MOS electrode 42, the conductive state of the MOS transistor is turned off. When a voltage is not applied to the MOS electrode 42, the MOS transistor is brought into a conductive state. The conduction of a circuit from which a voltage is applied to the MOS electrode is controlled by a control unit. The voltage to be applied to the MOS electrode 42 in the MOS region is referred to, for example, as a MOS gate voltage.

On the other hand, in the IGBT region, when a positive voltage is applied to the trench electrode 22a, an inversion layer is formed in the body layer 12 near the trench insulating film 21a. Then, the emitter layer 13 is brought into a conductive state with the drift layer 10. When a voltage is not applied to the trench electrode 22a, the conductive state between the emitter layer 13 and the drift layer 10 is turned off. The conduction of a circuit from which a voltage is applied to the trench electrode 22 is controlled by the control unit. Turning off the conductive state of the IGBT structure is referred to as turn-off. The voltage to be applied to the trench electrode 22 in the IGBT region is referred to, for example, as an IGBT gate voltage.

The drain layer 15d and the body layer 12 in the semiconductor device 1 are coupled with each other by the emitter wiring layer 32. Therefore, the carriers that have turned on the MOS transistor are discharged to the emitter wiring layer 32.

Figure 2:
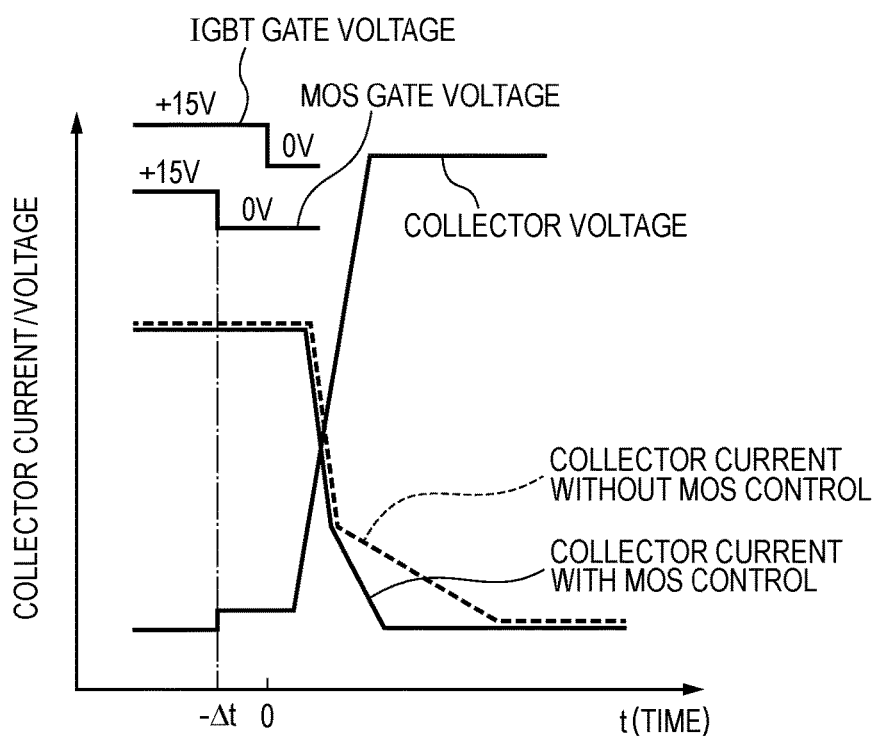
FIG. 2 is a graph illustrating the operation of a semiconductor device according to First Embodiment.

FIG. 2 is a graph illustrating the operation of the semiconductor device 1 according to First Embodiment. The horizontal axis represents time, and the vertical axis represents current and voltage. Currents represented on the vertical axis are collector currents. Voltages represented on the vertical axis are the IGBT gate voltage, the MOS gate voltage, and a collector voltage.

As illustrated in FIG. 2, a positive voltage, for example, +15 V is applied as the IGBT gate voltage. Thereby, the emitter layer 13 is brought into a conductive state with the drift layer 10. In addition, a positive voltage, for example, +15 V is applied as the MOS gate voltage. Thereby, the conductive state of the MOS transistor is turned off. Therefore, for example, holes are accumulated in the floating layer 18 as carriers. The saturation voltage Vce (sat) of the collector voltage can be reduced in this way.

Next, the IGBT in the IGBT region is turned off at a predetermined time (t=0) by setting the IGBT gate voltage to 0, but immediately before that (t=−Δt), the MOS gate voltage is set to 0 V. Thereby, the MOS transistor is brought into a conductive state. Then, the carriers accumulated in the floating layer 18 move to the drain layer 15d via the source layer 15s and the channel layer 14. The drain layer 15d is coupled with the emitter wiring layer 32. Therefore, the carriers accumulated in the floating layer 18 are discharged to the emitter wiring layer 32. At this time, the saturation voltage Vce (sat) of the collector voltage rises.

Next, the IGBT in the IGBT region is turned off at a predetermined time (t=0) by setting the IGBT gate voltage to 0 V. Thereby, the collector current can be quickly reduced as indicated by the solid line (with MOS control). Therefore, a turn-off operation can be accelerated, that is, a transition time to a current zero state in which the collector current never flows can be shortened.

As described above, the semiconductor device 1 includes a control unit that turns off the conduction of a circuit from which a voltage is applied to the MOS electrode 42 before turning off the conduction of a circuit from which a voltage is applied to the trench electrode 22a. Through such an operation of the control unit, the total number of carriers at turn-off can be reduced. Therefore, the turn-off loss Eoff can be suppressed. Thereby, even if a semiconductor device is designed with emphasis on the saturation voltage Vce (sat), the turn-off loss Eoff is not sacrificed, whereby the trade-off between the turn-off loss Eoff and the conduction loss Vce (sat) can be improved.

On the other hand, when there is no control by the MOS electrode 42, that is, when a positive voltage is applied to the MOS electrode, a rate at which a carrier density decreases after the turn-off becomes small, as indicated by the dotted line (without MOS control) in FIG. 2. Therefore, a transition time to a current zero state in which the collector current never flows cannot be shortened, and the turn-off loss Eoff cannot be suppressed. That is, when a MOS transistor as in the present embodiment is not provided, the trade-off between the turn-off loss Eoff and the conduction loss Vce (sat) cannot be improved.

First Embodiment: Manufacturing Method

Figure 3:
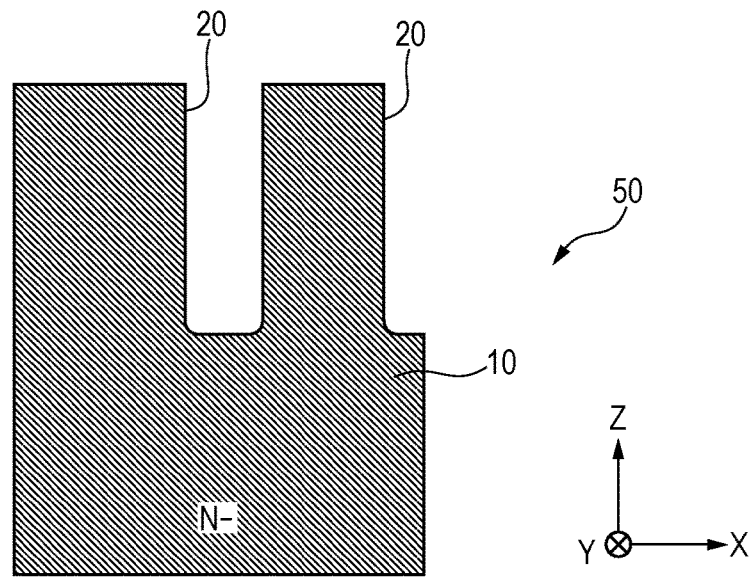
FIG. 3 is a process sectional view illustrating a manufacturing method of a semiconductor device according to First Embodiment, illustrating a step of forming a trench.
Figure 4:
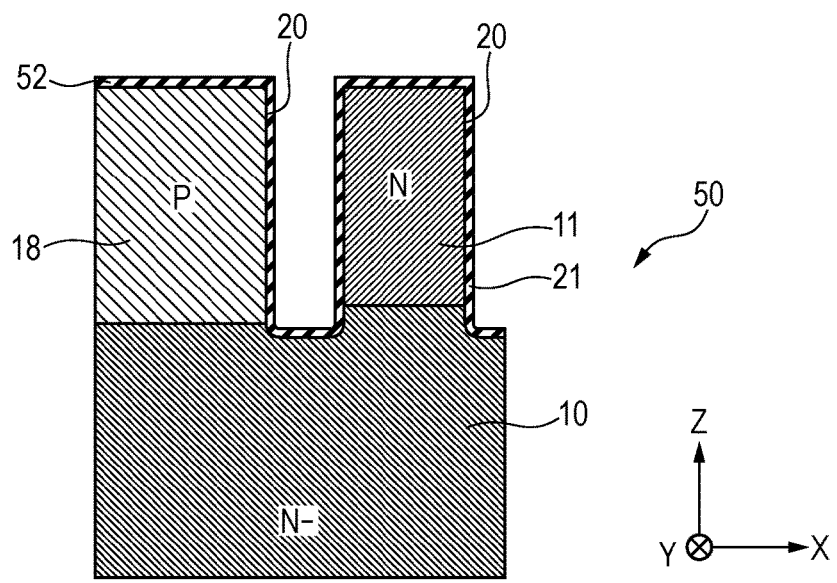
FIG. 4 is a process sectional view illustrating a manufacturing method of a semiconductor device according to First Embodiment, illustrating a step of forming a hole barrier layer and a floating layer.
Figure 5:
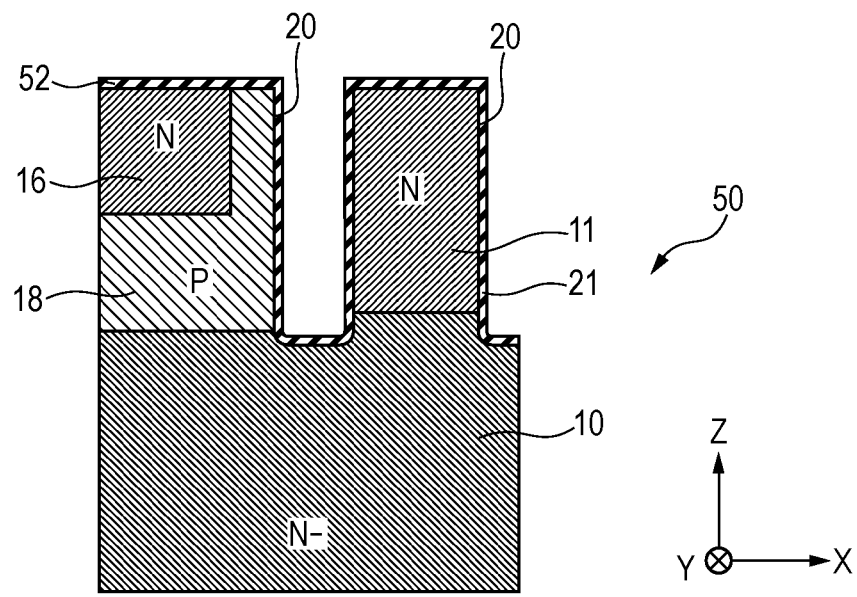
FIG. 5 is a process sectional view illustrating a manufacturing method of a semiconductor device according to First Embodiment, illustrating a step of forming a well layer.
Figure 6:
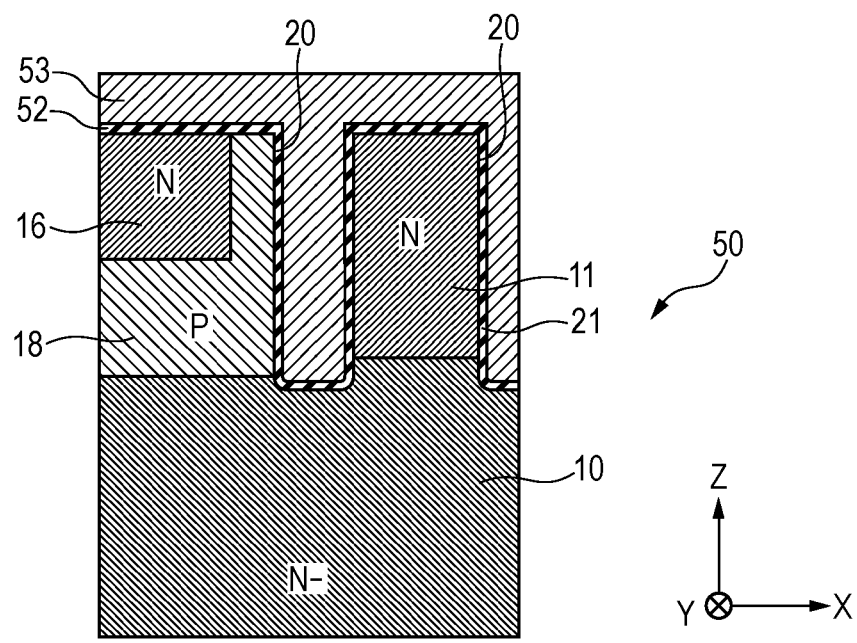
FIG. 6 is a process sectional view illustrating a manufacturing method of a semiconductor device according to First Embodiment, illustrating a step of forming a trench insulating film and that of depositing polysilicon.
Figure 7:
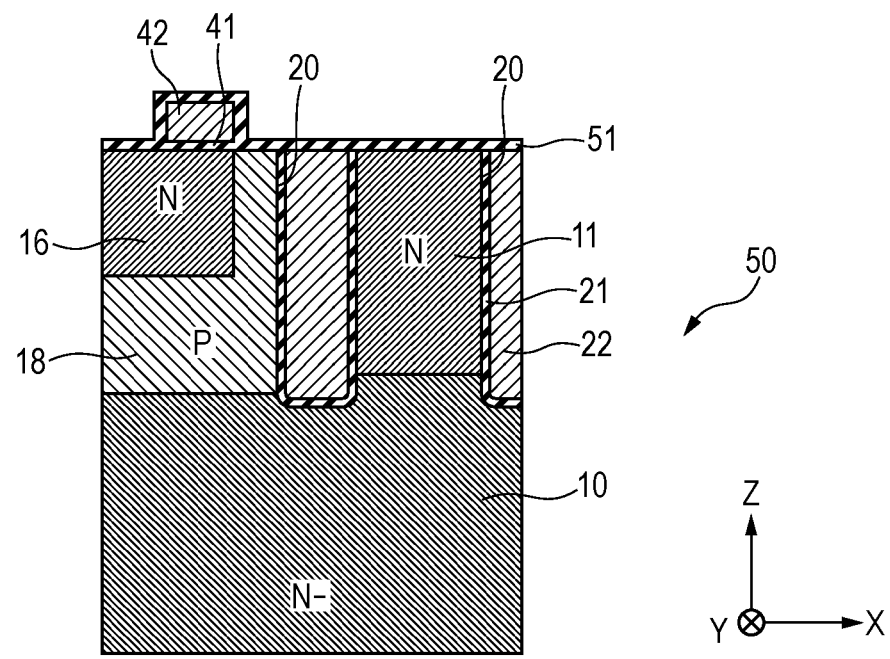
FIG. 7 is a process sectional view illustrating a manufacturing method of a semiconductor device according First Embodiment, illustrating a step of forming a trench electrode and a MOS electrode.
Figure 8:
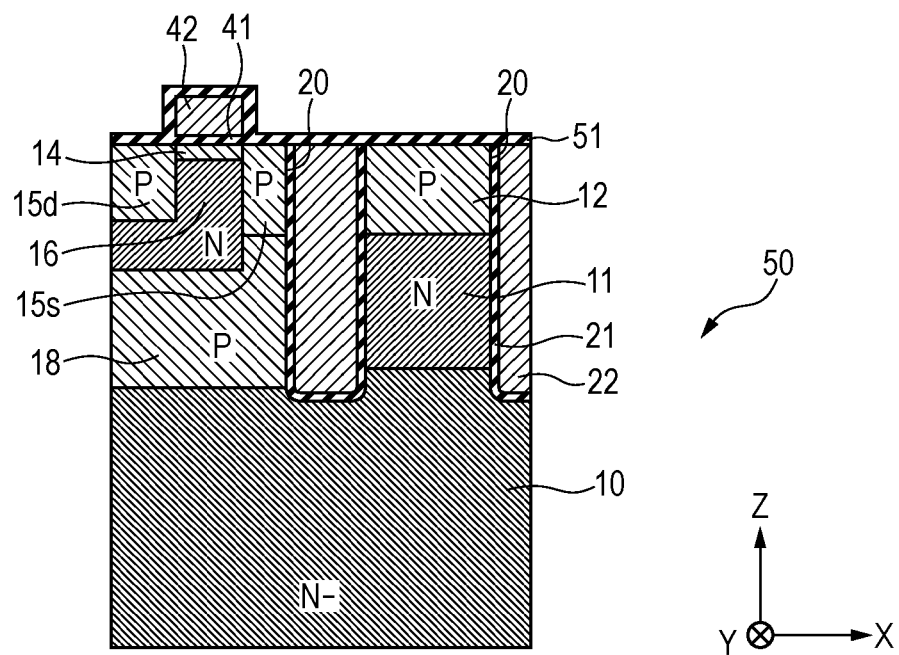
FIG. 8 is a process sectional view illustrating a manufacturing method of a semiconductor device according to First Embodiment, illustrating a step of forming a body layer, a channel layer, a drain layer, and a source layer.
Figure 9:
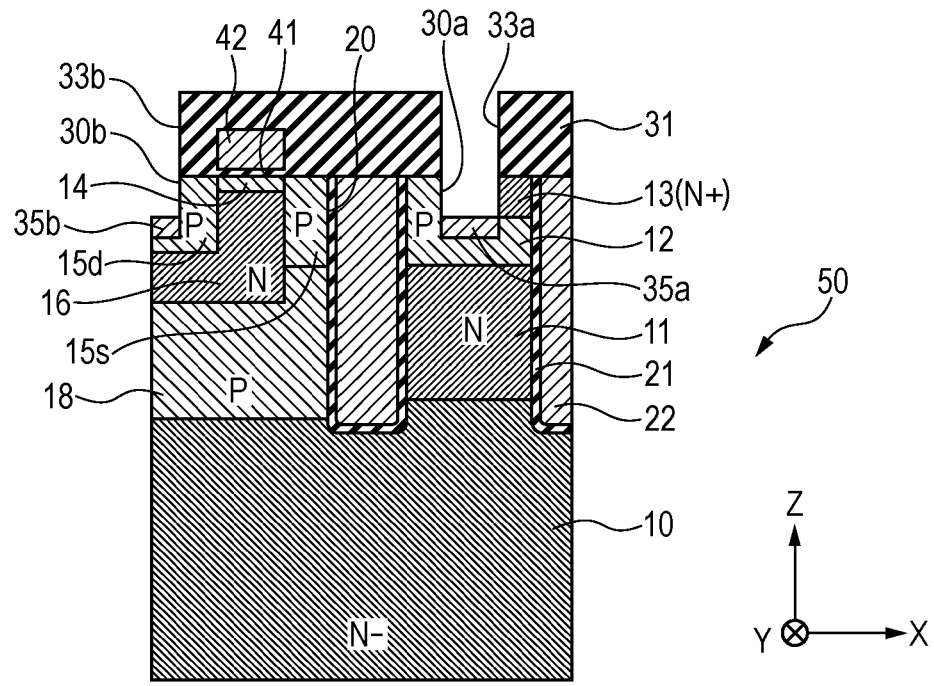
FIG. 9 is a process sectional view illustrating a manufacturing method of a semiconductor device according to First Embodiment, illustrating a step of forming an interlayer insulating layer, a through trench, a contact trench, and a contact layer.
Figure 10:
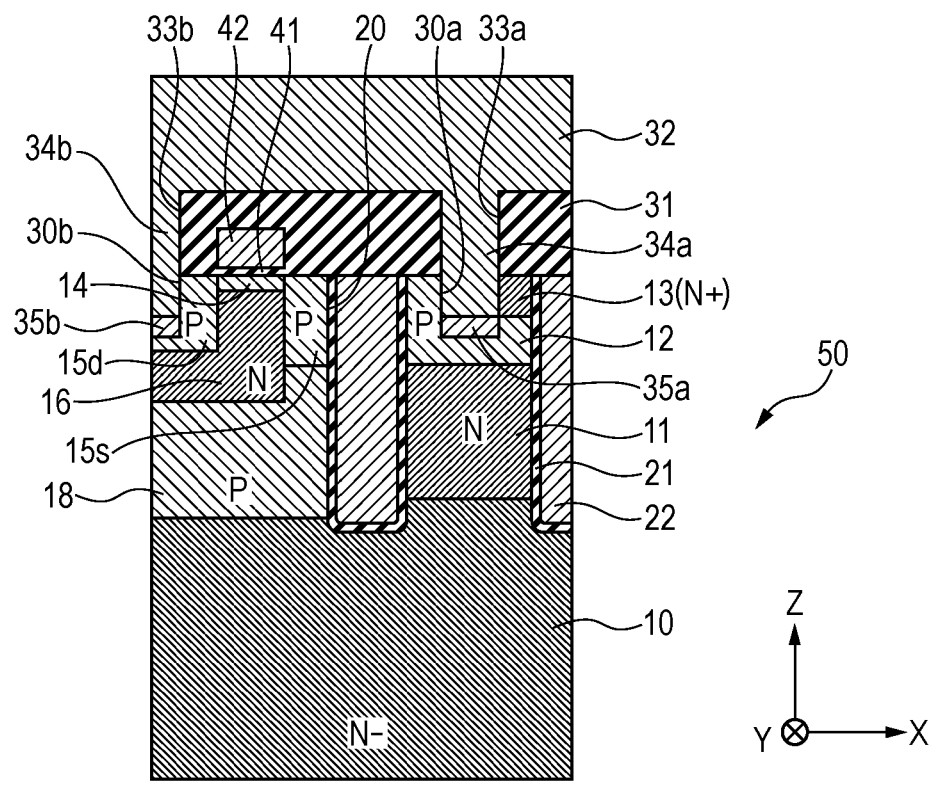
FIG. 10 is a process sectional view illustrating a manufacturing method of a semiconductor device according to First Embodiment, illustrating a step of forming an emitter wiring layer.

Next, a manufacturing method of the semiconductor device 1 according to the present embodiment will be described. FIGS. 3 to 10 are process sectional views each illustrating a manufacturing method of the semiconductor device 1 according to First Embodiment, in which: FIG. 3 illustrates a step of forming the trench 20; FIG. 4 illustrates a step of forming the hole barrier layer 11 and the floating layer 18; FIG. 5 illustrates a step of forming the well layer 16; FIG. 6 illustrates a step of forming the trench insulating film 21 and that of depositing polysilicon; FIG. 7 illustrates a step of forming the trench electrode 22 and the MOS electrode 42; FIG. 8 illustrates a step of forming the body layer 12, the channel layer 14, the drain layer 15d, and the source layer 15s; FIG. 9 illustrates a step of forming the interlayer insulating layer 31, the through trenches 33a and 33b, the contact trenches 30a and 30b, and the contact layers 35a and 35b; and FIG. 10 illustrates a step of forming the emitter wiring layer 32.

For example, an n-type silicon single crystal wafer is first provided as the semiconductor substrate 50, as illustrated in FIG. 3. The semiconductor substrate 50, doped with, for example, a low concentration of phosphorus as an impurity, is provided. The semiconductor substrate 50 includes the n-type drift layer 10. However, the semiconductor substrate 50 is not limited to one containing silicon as a material, but may be one containing another semiconductor material.

Then, the trench 20 is formed in the upper surface of the semiconductor substrate 50 by, for example, anisotropic dry etching using an unillustrated patterned hard mask film or the like. The trench 20 is formed to extend, in a plane parallel to the upper surface of the semiconductor substrate 50, in the one direction, that is, in the Y-axis direction. A plurality of the trenches 20 may be formed. Thereafter, the hard mask film or the like is removed by, for example, wet etching or the like.

Next, an insulating film 52 having a predetermined thickness is formed over both the upper surface of the semiconductor substrate 50 and the inner surface of the trench 20 by, for example, thermal oxidation or the like, as illustrated in FIG. 4. A portion of the insulating film 52, which is formed over the inner surface of the trench 20, becomes the trench insulating film 21. In this way, the trench insulating film 21 is formed over the inner surface of the trench 20.

In addition, n-type impurities, such as phosphorus, are introduced into the upper surface side of the semiconductor substrate 50 by ion implantation or the like using an unillustrated patterned resist film as a mask. Thereby, the hole barrier layer 11 is formed on the upper surface side of the semiconductor substrate 50. In addition, p-type impurities, such as boron, are introduced into the upper surface side of the semiconductor substrate 50 by ion implantation or the like using an unillustrated patterned resist film as a mask. Thereby, the floating layer 18 is formed on the upper surface side of the semiconductor substrate 50.

The drift layer 10 is located below the hole barrier layer 11 and the floating layer 18. In the semiconductor substrate 50 including the n−-type drift layer 10, the n-type hole barrier layer 11 and the p-type floating layer 18 are formed over the drift layer 10 in this way. After the each ion implantation, the resist film is removed by ashing or the like.

Next, n-type impurities, such as phosphorus, are introduced into the upper surface side of the floating layer 18 by ion implantation or the like using an unillustrated patterned resist film as a mask, as illustrated in FIG. 5. Thereby, the well layer 16 is formed on the upper surface side of the floating layer 18. After the ion implantation, the resist film is removed by ashing or the like.

Next, a conductive film 53 is deposited over the insulating film 52 in the semiconductor substrate 50 and over the insulating film 52 in the trench 20 so as to fill up the inside of the trench 20 by, for example, CVD or the like, as illustrated in FIG. 6. The conductive film 53 is a doped polysilicon film doped with, for example, phosphorus. Next, the conductive film 53 is etched back to the insulating film 52 by, for example, dry etching or the like.

In this way, the trench electrode 22 is formed in the trench 20 in which the trench insulating film 21 is formed, as illustrated in FIG. 7. Next, the MOS electrode 42 is formed over the well layer 16. The MOS electrode 42 may be formed by leaving, when the conductive film 53 is etched back, the conductive film 53 by covering a portion to become the MOS electrode 42 with a mask or the like. The insulating film 52 between the MOS electrode 42 and the semiconductor substrate 50 becomes the MOS insulating film 41. As described above, the MOS insulating film 42 is formed over the upper surface of the semiconductor substrate 50 near the trench 20, and the MOS electrode 42 is formed over the upper surface of the semiconductor substrate 50 over which the MOS insulating film 42 is formed. Thereafter, a patterned resist film 51 is formed over each of the MOS electrode 42, the trench electrode 22, and the semiconductor substrate 50.

Next, p-type impurities, such as boron, are introduced into the upper surface side of the well layer 16 so as to penetrate the MOS electrode 42 by ion implantation using the patterned resist film 51 as a mask, as illustrated in FIG. 8. Thereby, the channel layer 14 is formed on the upper surface side of the well layer 16. After the ion implantation, the resist film 51 is removed by asking or the like.

In addition, p-type impurities, such as boron, are introduced to the upper surface of the hole barrier layer 11 in the IGBT region and to the upper surface of the floating layer 18 in the MOS region by ion implantation or the like using an unillustrated patterned resist film as a mask. Thereby, the drain layer 15d and the source layer 15s are formed on the upper surface side of the floating layer 18. The drain layer 15d and the source layer 15s are formed to sandwich the well layer 16 and the channel layer 14.

The source layer 15s is formed to be in contact with the floating layer 18. The impurity concentration of each of the drain layer 15d and the source layer 15s is made higher than that of the floating layer 18.

In addition, the body layer 12 is formed over the hole barrier layer 11 in the IGBT region. As described above, the body layer 12, the drain layer 15d, and the source layer 15s may be formed at the same time. The channel layer 14, which is provided below the MOS electrode 42 and is in contact with the MOS insulating film 41, and the drain layer 15d and the source layer 15s, which are provided on both sides of the channel layer 14 so as to sandwich the channel layer 14, are formed in this way. After the ion implantation, the resist film is removed by asking or the like.

Next, n-type impurities, such as arsenic, are introduced by performing ion implantation or the like using an unillustrated patterned resist film as a mask, as illustrated in FIG. 9. Thereby, the emitter layer 13 is partially formed over the body layer 12. In this way, the body layer 12 to be provided over the first semiconductor layer and the emitter layer 13 to be provided over the body layer 12 are formed over the semiconductor substrate 50 so as to be in contact with the trench insulating film 21. A plurality of the trenches 20 are formed, and the body layer 12 and the emitter layer 13 are formed between the adjacent trench electrodes. After the ion implantation, the resist film is removed by ashing or the like.

Then, the interlayer insulating layer 31 is formed over the semiconductor substrate 50 by, for example, CVD or the like. The interlayer insulating layer 31 includes a silicon oxide film such as, for example, a PSG (Phosphosilicate Glass) film. However, the interlayer insulating layer 31 may include a BPSG (Borophosphosilicate Glass) film, an NSG (Non-doped Silicate Glass) film, a SOG (Spin-On-Glass) film, or a composite film thereof, other than a PSG film.

Next, an unillustrated patterned resist film or the like is formed over the interlayer insulating layer 31. Then, the through trenches 33a and 33b are formed in the interlayer insulating layer 31 by, for example, anisotropic dry etching or the like using the patterned resist film or the like. The through trenches 33a and 33b, which penetrate the interlayer insulating layer 31 formed over the semiconductor substrate 50, are formed in this way.

Thereafter, the unnecessary resist film is removed by ashing or the like. Subsequently, the contact trench 30a, communicating with the through trench 33a and reaching the body layer 12, is formed by, for example, anisotropic dry etching using the interlayer insulating layer 31. In addition, the through trench 30b, communicating with the through trench 33b and reaching the drain layer 15d, is formed.

The contact layer 35a may be formed in the body layer 12 and the contact layer 35b may be formed in the drain layer 15d by ion implanting p-type impurities, for example, via the contact trenches 30a and 30b.

Next, a metal layer containing aluminum or the like is formed over the interlayer insulating layer 31, in the through trench 33a and the contact trench 30a, and in the through trench 33b and the contact trench 30b, so as to be coupled with the body layer 12 and the drain layer 15d by, for example, sputtering or the like, as illustrated in FIG. 10. Thereby, the emitter wiring layer 32 is formed over the interlayer insulating layer 31. The contact 34a is formed in the through trench 33a and the contact trench 30a. The contact 34b is formed in the through trench 33b and the contact trench 30b.

As described above, the emitter wiring layer 32, coupling the drain layer 15d and the body layer 12 together, is formed over the interlayer insulating layer 31 via the through trenches 33a and 33b. Before the metal layer is formed, a barrier metal film may be formed over each of the interlayer insulating layer 31, the inner surface of the through trench 33, and the inner surface of the contact trench 30.

In addition, the field stop layer and the collector layer are formed below the drift layer 10. Further, a collector wiring layer is formed to be in contact with the collector layer. The semiconductor device 1 is manufactured in this way.

Next, advantages of the present embodiment will be described. In the semiconductor device 1, the drain layer 15d of the MOS transistor is coupled with the emitter wiring layer 32. Thereby, the carriers accumulated in the floating layer 18 can be discharged to the emitter wiring layer 32 via the MOS transistor. Therefore, the saturation voltage Vce (sat) can be reduced and a turn-off loss can be reduced.

In the semiconductor device 1 according to the present embodiment, the saturation voltage Vce (sat) and the turn-off loss Eoff can be reduced at the same time, as described above. Therefore, even if a semiconductor device is designed with emphasis on the saturation voltage Vce (sat), the turn-off loss Eoff is not sacrificed. Therefore, the trade-off between the turn-off loss Eoff and the conduction loss Vce (sat) can be improved.

The channel layer 14, the source layer 15s, and the drain layer 15d of the MOS transistor are allowed to be semiconductor layers of the same conductivity type, for example, a p-type. Thereby, in the MOS transistor of the semiconductor device 1, a depletion type MOS transistor is formed by the MOS electrode 42, the MOS insulating film 41, the channel layer 14, the source layer 15s, and the drain layer 15d. Therefore, the accumulation and discharge of carriers can be synchronized with the ON and OFF operation of the IGBT.

For example, when the IGBT is brought into a conductive state by applying a voltage to the trench electrode 22 in the IGBT, the conduction of the MOS transistor can be turned off by applying a voltage to the MOS electrode 42. Thereby, carriers can be accumulated in the floating layer 18.

On the other hand, when it is attempted to turn off the conduction of the IGBT by setting the voltage of the trench electrode 22 in the IGBT to 0 V, the MOS transistor is brought into a conductive state by setting the voltage of the MOS electrode 42 to 0 V immediately before the turn-off. Thereby, the carriers accumulated in the floating layer 18 can be discharged to the emitter wiring layer 32. By providing a time lag between when the voltage of the trench electrode 22 is set to 0 V and when that of the MOS electrode 42 is set to 0 V, as described above, a transition time to a state in which a current occurring when the IGBT is turned off becomes 0 can be shortened.

Second Embodiment

Figure 11:
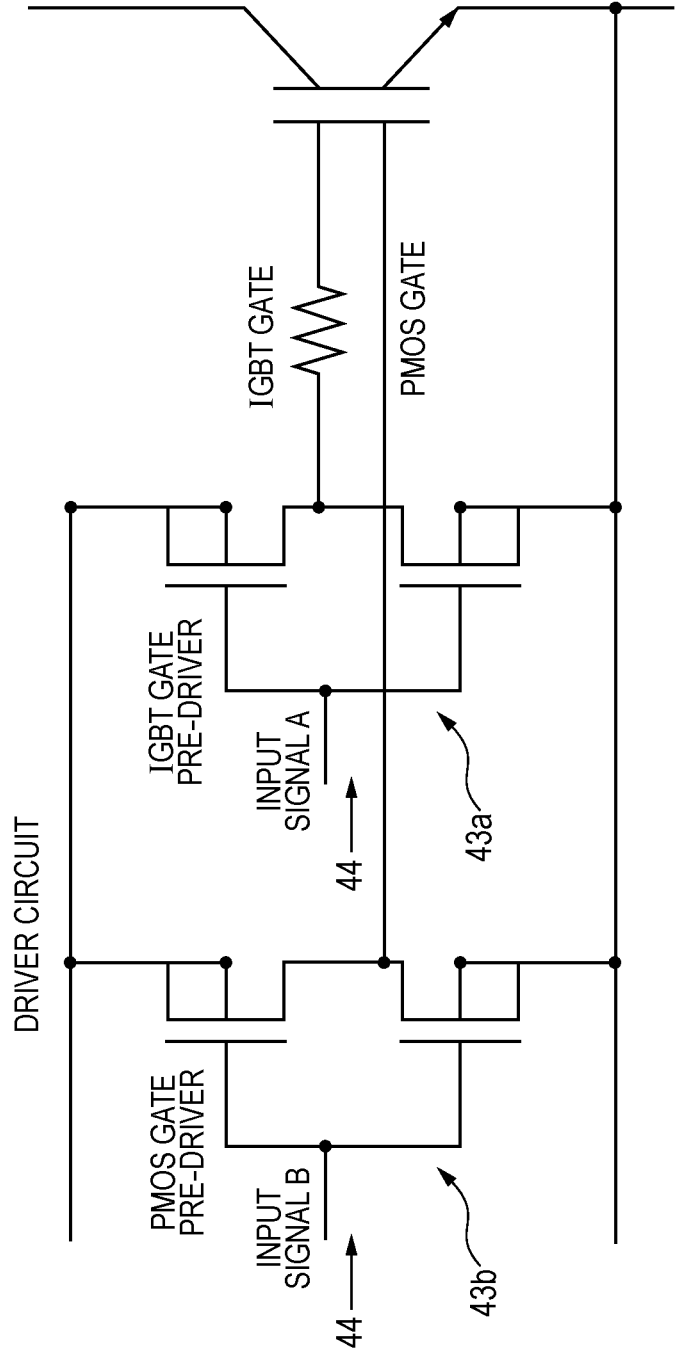
FIG. 11 is a circuit view illustrating a driver circuit in a semiconductor device according to Second Embodiment.
Figure 12:
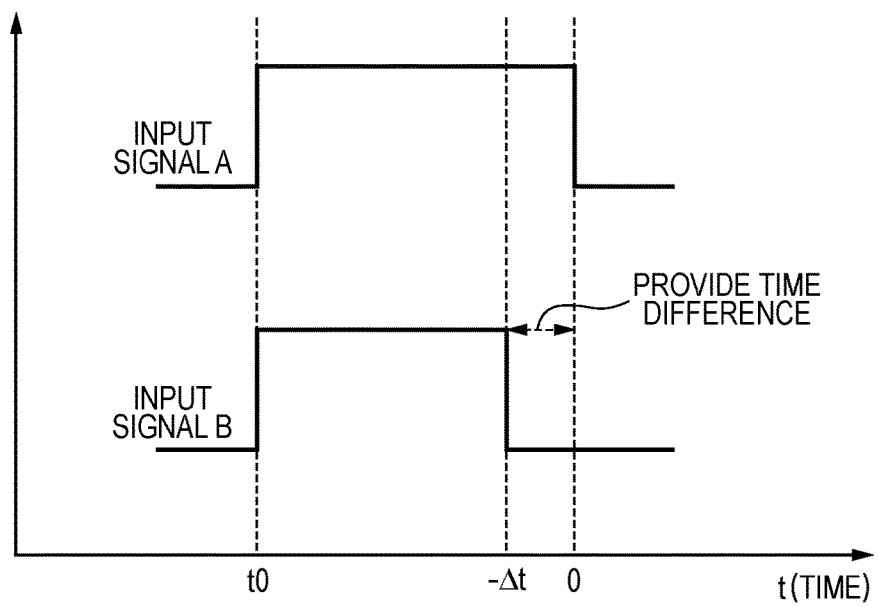
FIG. 12 is a graph illustrating input signals for controlling a semiconductor device according to Second Embodiment.

Next, a semiconductor device according to Second Embodiment will be described. Second Embodiment relates to an embodiment in which two systems, for both the trench electrode 22 in the IGBT region and a MOS electrode to discharge carriers, are provided as drivers for driving a semiconductor device. FIG. 11 is a circuit view illustrating a driver circuit in a semiconductor device 2 according to Second Embodiment. FIG. 12 is a graph illustrating input signals for controlling a semiconductor device according to Second Embodiment.

The semiconductor device 2 includes both an IGBT gate pre-driver 43a in a circuit from which a voltage is applied to the trench electrode 22 and a MOS gate pre-driver 43b in a circuit from which a voltage is applied to the MOS electrode, as illustrated in FIG. 11. A control unit 44 controls the two systems of these pre-drivers by outputting an input signal A and an input signal B to the IGBT gate pre-driver 43a and the MOS gate pre-driver 43b, respectively. Specifically, the control unit 44 controls such that the IGBT gate pre-driver 43a and the MOS gate pre-driver 43b are driven with a time lag.

The control unit 44 outputs, at time t=t0, the input signal A to the IGBT gate pre-driver 43a and the input signal B to the MOS gate pre-driver 43b, as illustrated in FIG. 12. Thereby, the IGBT gate voltage and the MOS gate voltage become, for example, +15 V. Therefore, the IGBT is brought into a conductive state and the MOS transistor into a turned-off state. Thereby, carriers are accumulated in the floating layer 18.

The control unit 44 sets the MOS gate voltage to 0 V at time t=−Δt. Thereby, the MOS transistor is brought into a conductive state. Then, the carriers accumulated in the floating layer 18 are discharged to the emitter wiring layer 32.

Next, the control unit 44 turns off the IGBT at time t=0 by setting the IGBT gate voltage to 0 V. Thereby, the collector current can be quickly reduced. Therefore, a turn-off operation can be accelerated.

According to the present embodiment, the semiconductor device 2 includes the IGBT gate pre-driver 43a and the MOS gate pre-driver 43b, and hence the conduction state of the MOS transistor can be turned off immediately before the IGBT structure is turned off. Therefore, the saturation voltage Vce (sat) can be reduced and a turn-off loss can be reduced. Configurations and advantages other than this are the same as those in First Embodiment.

Third Embodiment

Figure 13:
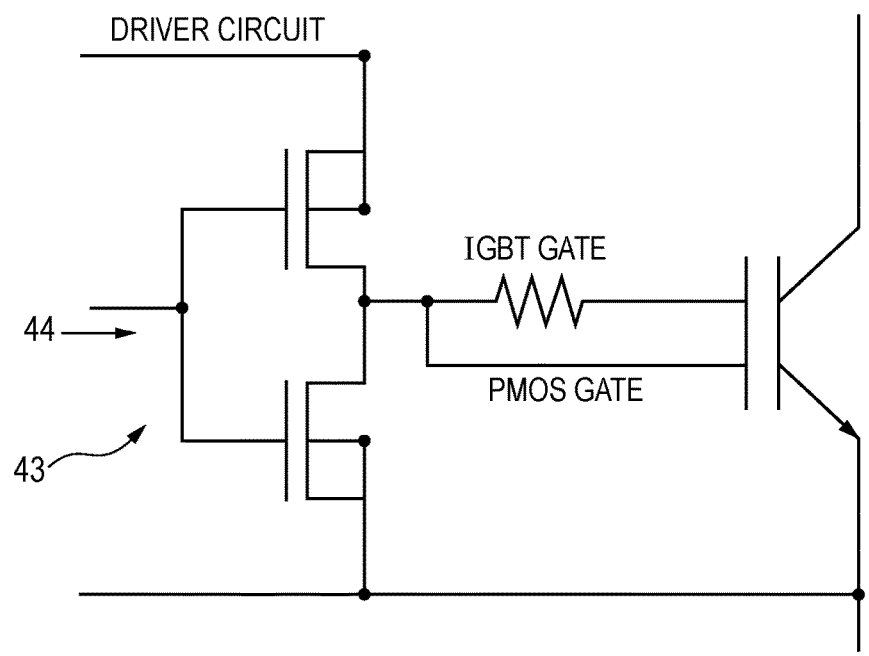
FIG. 13 is a circuit view illustrating a driver circuit in a semiconductor device according to Third Embodiment.
Figure 14:
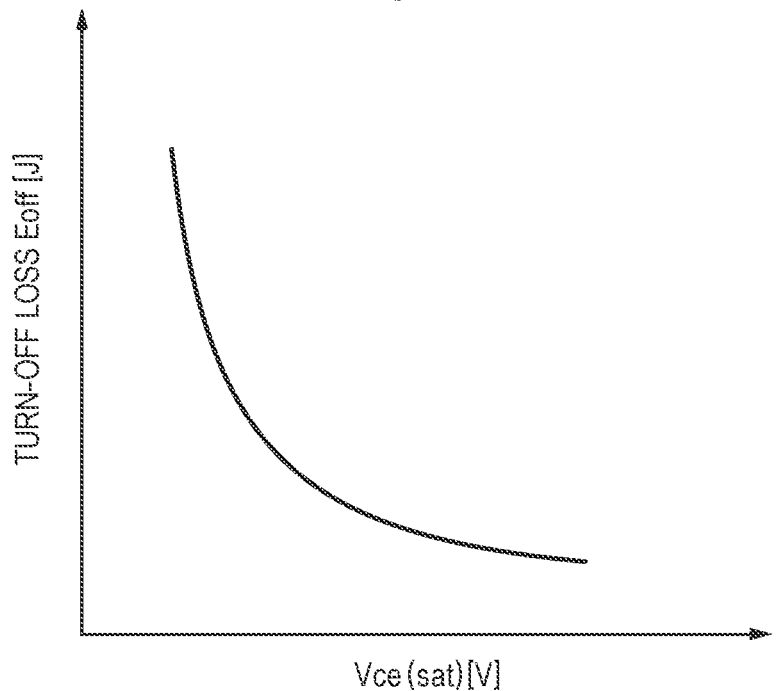
FIG. 14 is a graph illustrating a relationship between a saturation voltage and a turn-off loss.
Figure 15:
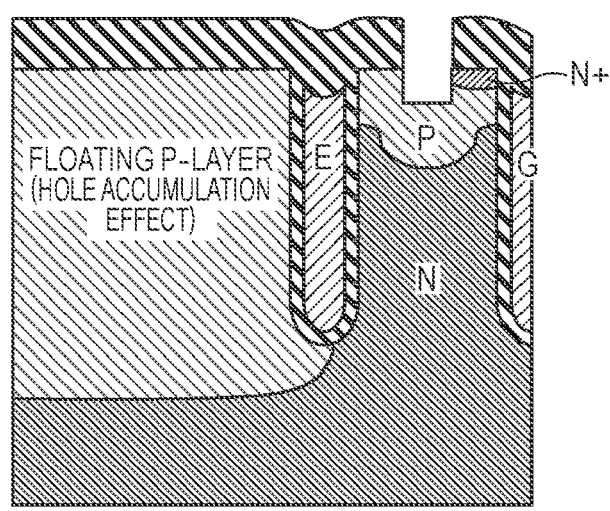
FIG. 15 is a sectional view illustrating a semiconductor layer of an IGBT.

Next, a semiconductor device according to Third embodiment will be described. Third Embodiment relates to an embodiment in which voltages to be applied to the MOS electrode 42 and the trench electrode 22 are controlled by using a common pre-driver without using a MOS gate pre-driver. FIG. 13 is a circuit view illustrating a driver circuit in a semiconductor device 3 according to Third Embodiment.

The semiconductor device 3 includes a pre-driver 43 common between a circuit from which a voltage is applied to the trench electrode 22 and a circuit from which a voltage is applied to the MOS electrode 42, as illustrated in FIG. 13. In the IGBT, the circuit from which a voltage is applied to the trench electrode 22 and the circuit from which a voltage is applied to the MOS electrode 42 may be short-circuited. Thereby, when controlling the pre-driver 43, the control unit 44 turns off the conduction of the circuit from which a voltage is applied to the MOS electrode 42 at the same time when turning off the conduction of the circuit from which a voltage is applied to the trench electrode 22. With such a configuration as well, the saturation voltage Vce (sat) can be reduced and a turn-off loss can be reduced. Configurations and advantages other than this are the same as in First and Second Embodiments.

The invention made by the present inventors has been specifically described above based on preferred embodiments; however, it is needless to say that the invention should not be limited to the above-described embodiments and various modifications may be made to the invention within a range not departing from the gist of the invention.

What is claimed is:

1. A semiconductor device comprising:
    a semiconductor substrate having an upper surface;
    a trench electrode provided in a trench formed in the upper surface;
    a trench insulating film provided between the trench electrode and the semiconductor substrate;
    a MOS electrode provided over the semiconductor substrate near the trench electrode; and
    a MOS insulating film provided between the MOS electrode and the semiconductor substrate,
    wherein the semiconductor substrate comprises:
    a first semiconductor layer of a first conductivity type that a lower end of the trench electrode has reached;
    a second semiconductor layer of a second conductivity type that is provided over the first semiconductor layer and is in contact with the trench insulating film;
    a third semiconductor layer of the first conductivity type provided over the second semiconductor layer;
    a fourth semiconductor layer that is provided below the MOS electrode and is in contact with the MOS insulating film; and
    one and the other of fifth semiconductor layers that are provided on both sides of the fourth semiconductor layer so as to sandwich the fourth semiconductor layer, and
    wherein the semiconductor device further comprises a wiring layer that couples the one of the fifth semiconductor layers and the second semiconductor layer together.

2. The semiconductor device according to claim 1, wherein the fourth semiconductor layer and the fifth semiconductor layers have the same conductivity type.

3. The semiconductor device according to claim 1, wherein the MOS electrode, the MOS insulating film, the fourth semiconductor layer, and the fifth semiconductor layers form a depletion type MOS transistor.

4. The semiconductor device according to claim 1,
wherein the fifth semiconductor layers have the second conductivity type.

5. The semiconductor device according to claim 1, further comprising a floating layer that is in contact with the other of the fifth semiconductor layers and is provided over the first semiconductor layer.

6. The semiconductor device according to claim 5,
wherein an impurity concentration of the fifth semiconductor layers is higher than an impurity concentration of the floating layer.

7. The semiconductor device according to claim 1,
wherein a plurality of the trench electrodes are provided,
wherein the second semiconductor layer and the third semiconductor layer are provided between the adjacent trench electrodes, and
wherein the MOS electrode is provided over the semiconductor substrate other than between the adjacent trench electrodes.

8. The semiconductor device according to claim 1, further comprising a control unit that turns off conduction of a circuit from which a voltage is applied to the MOS electrode before turning off conduction of a circuit from which a voltage is applied to the trench electrode.

9. The semiconductor device according to claim 8, comprising an IGBT gate pre-driver for a circuit from which a voltage is applied to the trench electrode and a MOS gate pre-driver for a circuit from which a voltage is applied to the MOS electrode,
wherein the control unit controls two systems of the IGBT gate pre-driver and the MOS gate pre-driver.

10. The semiconductor device according to claim 1, comprising a control unit that turns off conduction of a circuit from which a voltage is applied to the MOS electrode at the same time when turning off conduction of a circuit from which a voltage is applied to the trench electrode.

11. The semiconductor device according to claim 10, comprising a pre-driver common between a circuit from which a voltage is applied to the trench electrode and a circuit from which a voltage is applied to the MOS electrode,
wherein the control unit controls the pre-driver.

\* \* \* \* \*